(12) United States Patent
Reinwald et al.

(10) Patent No.: US 9,350,443 B2
(45) Date of Patent: May 24, 2016

(54) CONTROL APPARATUS FOR A TRANSMIT AMPLIFIER UNIT

(71) Applicant: Tesat-Spacecom GmbH & Co. KG, Backnang (DE)

(72) Inventors: Gerhard Reinwald, Aspach (DE); Hanspeter Katz, Stuttgart (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 151 days.

(21) Appl. No.: 14/178,965

(22) Filed: Feb. 12, 2014

(65) Prior Publication Data

US 2014/0227968 A1   Aug. 14, 2014

(30) Foreign Application Priority Data

Feb. 14, 2013 (DE) .......................... 10 2013 002 477

(51) Int. Cl.
*H04B 7/10* (2006.01)
*H04B 7/185* (2006.01)
*H01J 23/34* (2006.01)
*H01J 25/34* (2006.01)

(52) U.S. Cl.
CPC ............ *H04B 7/18513* (2013.01); *H01J 23/34* (2013.01); *H01J 25/34* (2013.01)

(58) Field of Classification Search
CPC ........................... H04B 7/185; H04B 7/18519
USPC ................ 455/13.4, 68, 427, 12.1, 3.03, 511, 455/127.3
See application file for complete search history.

(56) References Cited

U.S. PATENT DOCUMENTS

| 2003/0078037 | A1 | 4/2003 | Auckland et al. | |
| 2006/0136103 | A1* | 6/2006 | Lee | B64G 1/24 701/13 |
| 2011/0151777 | A1* | 6/2011 | Kim | H04B 7/18528 455/13.4 |
| 2014/0184083 | A1* | 7/2014 | Pelton | H05B 37/0245 315/152 |

FOREIGN PATENT DOCUMENTS

| DE | 10 2009 015 090 A1 | 10/2010 |
| EP | 0 329 967 A1 | 8/1989 |
| EP | 0 740 434 A1 | 10/1996 |

* cited by examiner

*Primary Examiner* — John J Lee
(74) *Attorney, Agent, or Firm* — Crowell & Moring LLP

(57) ABSTRACT

A control apparatus for an earth-distant-platform includes a control unit, which includes with a control input and a control output, and a memory element. The memory element contains a plurality of operating value parameter sets for an RF transmit amplifier unit. The control input receives a control signal and, dependent on the control signal, the control unit selects an operating value parameter set from the memory element. The control output controls an energy supply unit and/or a preamplifier/linearization element using the selected operating value parameter set such that the RF transmit amplifier unit is operable in a defined operating state.

12 Claims, 4 Drawing Sheets

|     | Frequency/GHz      | 10.95 | 11.55 | 12.2  |
|-----|--------------------|-------|-------|-------|
| WB  | RF output power / W | 146.5 | 153.4 | 152.5 |
|     | DC power / W       | 230.5 | 232.1 | 229.2 |
| NB  | RF output power / W | 148.3 | 148.4 | 148.6 |
|     | DC power / W       | 219.9 | 222.4 | 225.0 |
|     | Δ DC power / W     | -10.6 | -9.7  | -4.2  |

Fig. 3

CONTROL APPARATUS FOR A TRANSMIT AMPLIFIER UNIT

CROSS-REFERENCE TO RELATED APPLICATIONS

The present application claims priority under 35 U.S.C. §119 to German Patent Application No. 10 2013 002 477.3, filed Feb. 14, 2013, the entire disclosure of which is herein expressly incorporated by reference.

BACKGROUND AND SUMMARY OF THE INVENTION SECTION

The present invention relates to communications technology, particularly to satellite communications using a traveling wave tube. In addition, the present invention relates to a control apparatus in particular for a traveling wave tube, an earth-distant platform, particularly a satellite, having an apparatus according to the invention, as well as a method for setting an operating state of a traveling wave tube.

A traveling wave tube (TWT) is a highly specialized vacuum tube that is used for amplifying RF signals. Traveling wave tubes are particularly favored on earth-distant platforms, such as satellites, to provide RF signals for communications with a communications partner, for example an earth-proximate or ground station.

Accordingly, traveling wave tubes amplify the RF signal, whereby free electrons, which move in the tube from one cathode towards an anode and are then captured by collectors, release part of their kinetic energy as an electrical signal to be amplified. In doing so, traveling wave tubes preferably have a field of application in a frequency range from 0.3 to 50 GHz, wherein amplification is usually feasible in a range of 30-60 dB. Based on their high efficiency of up to 70%, traveling wave tubes particularly above 10 GHz are superior to semiconductor amplifiers.

For their operation, traveling wave tubes require a heating voltage for the hot cathode of several V to generate the electron beam, wherein the electrons are subsequently accelerated toward an anode and ultimately after passing through a region with a helical winding, they are captured by a collector. The traveling wave tube thus allows for energy recovery by means of the recovered electrons, which results in its relatively high efficiency.

In addition, an axial magnetic field generated by a permanent magnet or electromagnet is required as well as an operating voltage or accelerating voltage in the kV range. Also required are operating variables or operating energy variables, which may be used, for example, to control or focus voltages for the electron gun. In addition, cooling of the collector and often of the helix may be required, particularly for high-power applications. Especially in satellite technology, an electrical supply unit is referred to as an electronic power conditioner (EPC). A unit comprised of a TWT and an EPC is referred to as a traveling wave tube amplifier (TWT).

Traveling tube amplifiers are used primarily as power amplifiers in satellites. The traveling wave tube thus mainly determines the high-frequency properties. In addition, a power supply or a control apparatus for a traveling wave tube is provided, which generates the supply voltage for the traveling wave tubes and also represents a telemetry or telecommand interface to the satellite. A power amplifier can be supplemented by a preamplifier, also known as a channel amplifier (CAMP), which can also contain a linearizer (LCAMP). In such a combination, such an apparatus is referred to as a high-frequency power module (microwave power module (MPM)).

Besides the high-frequency design of the traveling wave tube itself, the supply voltages primarily determine the high-frequency properties of the traveling wave tube. These voltages are adjusted in such a manner that the required performance features can be maintained over a required frequency range. Particularly for large frequency ranges, a compromise must be found between the frequency range and requirements.

Generally, a setting of the traveling wave tube is made in such a manner that the center of the achieved frequency range is set so that also on the end and thus in the entire frequency range required, the specified requirements are complied with. In the central region, these requirements are usually greatly exceeded.

In very broadband applications, it may occur that absolutely no operating state can be found that is able to cover the entire frequency range. In this case, sub-regions must be covered by various amplifiers.

The preamplifier of an MPM must thus be adapted to the tube properties, i.e., when the characteristics of the tube change, the setting of the preamplifier must be adapted correspondingly.

One aspect of the present invention is now the setting of a control apparatus of an earth-distant platform for an RF transmit amplifier unit, particularly of an associated energy supply unit and/or an associated preamplifier or channel amplifier and/or linearizer in such a flexible manner that in the orbit, for a satellite application, various settings can be selected via telecommand, depending on which frequency range or frequency band the amplifier or the RF transmit amplifier unit is to be operated in.

Accordingly, a control apparatus for an earth-distant platform, an earth-distant platform, particularly a satellite, having an apparatus according to the invention, as well as a method for setting an operating state of an RF transmit amplifier unit are provided on an earth-distant platform according to the invention.

According to a first design of the present invention, a control apparatus for an earth-distant platform is disclosed, having a control unit with at least one control input and a control output and a memory element, wherein the memory element is arranged to store a plurality of operating value parameter sets for at least an RF transmit amplifier unit, wherein the control input is arranged to receive a control signal, wherein the control unit is arranged, based on the control signal, to select an operating value parameter set from the memory element, and wherein the control output is arranged, subject to using the selected operating value parameter set, to influence an energy supply unit and/or linearization element in such a manner that the RF transmit amplifier unit is operable in a certain operating state.

According to another design of the present invention, an earth-remote platform, particularly a satellite, having a control apparatus for a traveling wave tube, is disclosed.

According to another design of the present invention, a method for setting an operating state of a traveling wave tube, particularly an earth-distant platform, is disclosed, having the steps: receiving a control signal; selecting an operating energy value parameter set from a plurality of operating energy value parameter sets, which are stored locally in a memory element; and adjusting the operating state of the traveling wave tube, based on the selected operating energy value parameter set.

According to a first design of the present invention, a control apparatus for an RF transmit amplifier unit is disclosed, having an energy supply unit, wherein the energy supply unit is arranged to provide a plurality of operating energy values defining an operating energy value set to a traveling wave tube, wherein the operating energy value set determines an operating state of the traveling wave tube, wherein a plurality of operating states can be determined by means of a plurality of operating energy value sets, and a control unit, wherein the control unit has at least a control input, a control output, as well as a memory element, wherein the memory element is arranged to store a plurality of operating energy value parameter sets, wherein each operating energy value parameter set is associated with an operating value set and wherein by means of selecting a certain operating energy value parameter set, a certain operating energy value set of the energy supply unit can be adjusted in such a manner that the traveling wave tube is operable in the associated defined operating state.

In addition, the present invention is described taking into account a traveling wave tube as an RF transmit amplifier unit. These designs however pertain to any RF transmit amplifier unit, particularly also to a semiconductor amplifier. If in addition an operating energy value set or operating energy value parameter set is described or used, this shall generally refer to an operating value set or operating value parameter set.

According to the invention, a control apparatus for a traveling wave tube, thus an electronic power conditioner, is provided for actuating and for operating a traveling wave tube. It can have, but is not required to have, a channel amplifier and/or a linearizer and thus essentially can represent a microwave power module.

By way of example in the case of a satellite application, the control apparatus obtains, for example, a command from a ground station regarding a desired operating mode of the traveling wave tube. In addition to other possible information, this may include in particular information regarding on which frequency or in which frequency band the traveling wave tube or the traveling wave tube amplifier is to be operated.

It is hereby advantageous that no complex information is transmitted that contains detailed information or parameters regarding the setting of an energy supply module. Instead, only information is transmitted as to which frequency band is now to be used for the transmission. All parameters required for setting and operating the control apparatus and thus the traveling wave tube are on hand in a memory element in the control apparatus. These pieces of information or parameters may be provided beforehand by a manufacturer of the satellite or at least the traveling wave tube amplifier, so that one can ensure that the traveling wave tube implements the required transmission properties in the best possible manner. A corresponding plurality of parameter sets may have been determined in a test operation during production for example and stored in the memory.

Thus, essentially only one piece of information is transmitted as a telecommand, indicating that the traveling wave tube amplifier is to now operate in a certain frequency band, Possibly, a piece of information may also be transmitted as to which modulation procedure is to be used for the data transmission. In doing so, these two pieces of information, which can be transmitted with comparatively little data volume to an earth-distant platform, may access in particular extensive parameter data in the memory element to best operate or parameterize the traveling wave tube, taking into consideration the required transmission in each case.

By transmitting purely a piece of information, as to which transmission parameter set is now to be used from the memory element, and not for example (complex) control data or parameters themselves that directly execute the parameterization of an EPC, one also ensures that the traveling wave tube amplifier is operated exclusively with a complete and correct parameter set, which was desired, required, and tested in particular.

If for example the parameters themselves are transmitted via a telecommand from an earth station to a satellite and if in doing so a transmission error occurs, it may happen that all or some parameters are not correctly set, possibly do not fit with other parameters, and thus a transmission based on an incorrect setting of the traveling wave tube is no longer possible. In a worst case scenario, this could result in damage to the traveling wave tube amplifier or the traveling wave tube, which in the event of a catastrophic defect could ultimately result in the total failure of the amplifier.

This is effectively prevented by the transmission of simple instructions via telecommands as to which transmission mode is to be selected, with a subsequent selection of this mode from a memory element, and the setting of all relevant parameters, based on this selected memory element. Based on a possible data transmission error when transmitting the telecommand, a non-desired mode could be set; however it would then take into account all correct parameters for this mode so that at least catastrophic damage of satellite elements is effectively prevented.

In this way, one can determine that the traveling wave tube amplifier can be operated in an optimal operating state by selecting a parameter set from the memory element. This results for example in improved efficiency and thus in better use of existing power. In the event of a satellite, it may thus be possible to construct it in a more cost-effective manner.

Storing a plurality of parameter sets allows one to set a plurality of frequency ranges with one device, for which if there was no adjustment capability, two or even more apparatuses would be required. In this way, the number of apparatuses stored in the satellite may be reduced and/or simpler redundancy concepts may be designed.

If, for example, multiple TWTAs/MPMs are provided in a satellite, then each TWTA/MPM can cover the entire frequency range. For that reason, each TWTA/MPM can be operated at each frequency of the redundancy concept, which simplifies the redundancy concept in certain circumstances.

According to the invention, a control unit on the satellite-side is provided that, based on a telecommand, selects from the memory element a desired or required operating energy value parameter set from a plurality of operating energy value parameter sets. Such an operating energy value parameter set defines all operating values, particularly in regard to the power supply and voltage actuation of a traveling wave tube, which are required to operate the traveling wave tube in a certain operating mode or operating state, and thus in a certain operating frequency band.

The operating energy value parameter set is thus to be considered as a piece of information, as to how the actual operating energy values, which are forwarded or applied to a traveling wave tube, are to be set. An energy supply unit of the control apparatus can thus be actuated by the controller in such a manner that, based on the information from the operating energy value parameter set, provides an energy value set and forwards or applies it to the traveling wave tube.

As an example, the operating energy value parameter set may contain a piece of information as to which anode voltage or cathode current is to be set for a certain operating state of the traveling wave tube. This information regarding the anode voltage is implemented, using the energy supply unit, in such a manner that the actual real anode voltage or cathode current associated with this information regarding the anode voltage or cathode current is generated and provided or applied to the traveling wave tube.

According to a preferred design of the present invention, the control input of the control unit can be arranged to receive a control signal for selecting a certain operating state or a certain operating energy value parameter set, wherein the control unit, based on the control signal, selects an operating energy value parameter set from the memory element and wherein the control output is arranged, using the selected operating energy value parameter set, to influence the energy supply unit in such a manner to set or issue the associated operating energy value set.

According to another preferred design of the present invention, the traveling wave tube can take up a certain operating state by setting or outputting the energy supply unit by means of the operating energy value set to the traveling wave tube.

The control apparatus is thus arranged so as to implement, from a plurality of operating energy value parameter sets, the selected one in such a manner that the operating energy values associated with this operating energy value parameter set are forwarded or applied to the traveling wave tube to thereby set a defined or desired operating state of the traveling wave tube.

According to another preferred design of the present invention, the operating energy values or operating values may be designed as values from the group consisting of currents or voltages that can be applied or forwarded to an RF transmit amplifier unit (4), a helix voltage, a collector voltage, a cathode current, an anode-0 voltage, an anode-1 voltage, a heater voltage, a Wehnelt voltage, an amplitude expansion, a phase rotation, a frequency response, and an amplification.

To operate the traveling wave tube, a plurality of currents or voltages are necessary due to the construction. This plurality or the entirety of all voltages and/or currents required to operate the traveling wave tube and if applicable other parameters, e.g., regarding signal processing, represent the operating energy values that can be depicted for a desired operating state as an operating energy value set. Generally, the operating energy values are operating values. A linearization element (LIN) may adapt its pre-processing or its transmission characteristics based on an operating state and thereby adapt to an amplitude expansion, phase shift, frequency response, and an amplification. This also applies if the linearization element is combined with a channel amplifier (LCAMP) or if the preamplifier is solely a channel amplifier (CAMP), in other words if it does not contain a linearizer. In this case, in particular only the amplification and the frequency shift of an HF signal may adapted.

According to another preferred design of the present invention, an operating state of the traveling wave tube may influence or determine at least the frequency operating range of the traveling wave tube, thus a frequency range.

According to another preferred design of the present invention, the control apparatus may be combined with a preamplifier, which includes amplifier stages and a linearization element, with a high-frequency input and a high-frequency output, to which a traveling wave tube can be connected. The linearization element may thus be arranged to receive a high-frequency signal via the high-frequency input and preprocess it, taking into account a desired or required operating state of the traveling wave tube. In doing so, preprocessing may affect in particular a transmission characteristic of the linearization element and influence it, based on a certain or desired operating state. In particular, the operating energy value parameter set may also have a piece of information or a parameter for adjusting the linearization element to adapt it, in its preprocessing of the high-frequency signal or its transmission characteristic, to a defined or required operating state of the traveling wave tube.

In this way, the memory element may also contain a piece of information for a certain operating energy value parameter set as to how a channel amplifier and/or linearizer is to be set, taking into account the desired or required operating state, and thus in particular the frequency band of the traveling wave tube.

According to a preferred design of the present invention, a transmission channel may be adapted to a required modulation procedure for data transmission by means of a plurality of operating energy value parameter sets.

In other words, for various modulation processes, even in a same frequency band, various operating energy values may be needed to adapt the traveling wave tube in a particularly preferred manner to a modulation procedure. In this way, an operating energy value parameter set may not only adjust an operating state in relation to a frequency band, but in addition, it may also adapt or optimize the traveling wave tube to a certain modulation procedure.

According to another preferred design of the present invention, the memory element may be arranged in the control unit, in the energy supply unit, or in the preamplifier/linearizer or be constructed as a distributed memory element and be arranged in several of the following: control unit, energy supply unit and preamplifier/linearizer element.

In this way, the control unit may, as a combination of a control unit with an energy supply unit, be constructed as an EPC, also in combination with a channel amplifier/linearization element and constructed as a channel amplifier/linearization element without an RF transmit amplifier unit purely as a preamplifier and with an RF transmit amplifier unit, particularly a traveling wave tube, as a TWTA or MPM.

According to another preferred design of the present invention, the apparatus may have at least two RF transmit amplifier units, at least two linearization elements, and at least an energy supply unit, wherein an RF transmit amplifier unit is assigned to each linearization element, wherein the at least one energy supply unit is arranged to operate the at least two RF transmit amplifier units and wherein the memory element has operating value parameter sets for the at least one energy supply unit and the at least two linearization elements.

According to another preferred design of the present invention, the RF transmit amplifier unit may be constructed as a unit from the group consisting of traveling wave tube and semiconductor amplifier.

Hereby, a plurality, for example 2, 3, up to n RF transmit amplification units and associated linearization elements may be connected to an energy supply unit for achieving individual operating states.

According to another preferred design of the present invention, the control signal may be receivable from outside a platform, in particular emanating out from the earth's surface, for example in the case that the control apparatus according to the invention for a traveling wave tube is provided on an earth-distant platform, in particular a satellite.

BRIEF DESCRIPTION OF THE DRAWING FIGURES

Embodiments of the invention are elaborated on below using the attached drawings.

Figure 4:
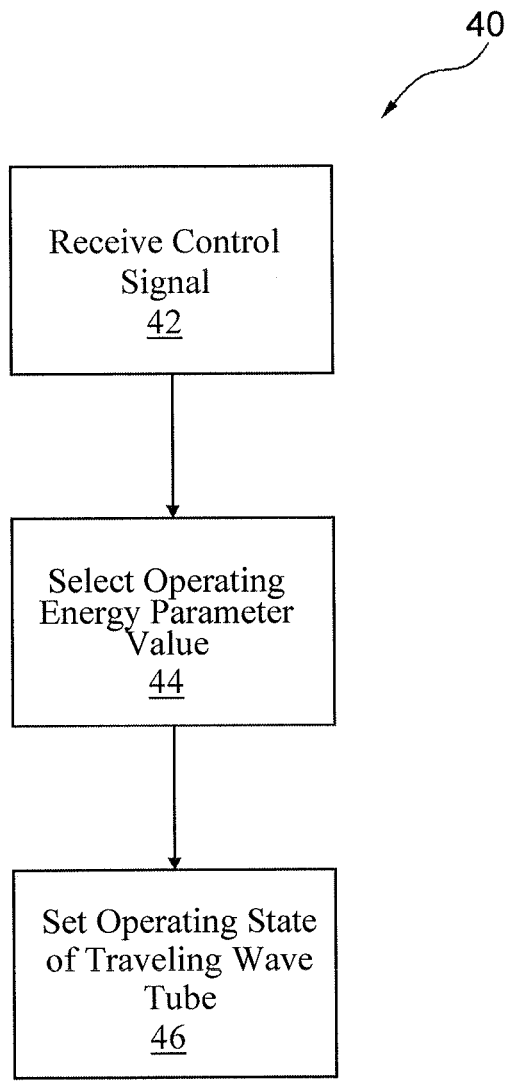

FIG. 3 a sample comparison of the high-frequency output power and power input of a traveling wave tube according to the present invention; and FIG. 4 a sample design of a method for setting an operating state of a traveling wave tube according to the present invention.

DETAILED DESCRIPTION

Figure 1:
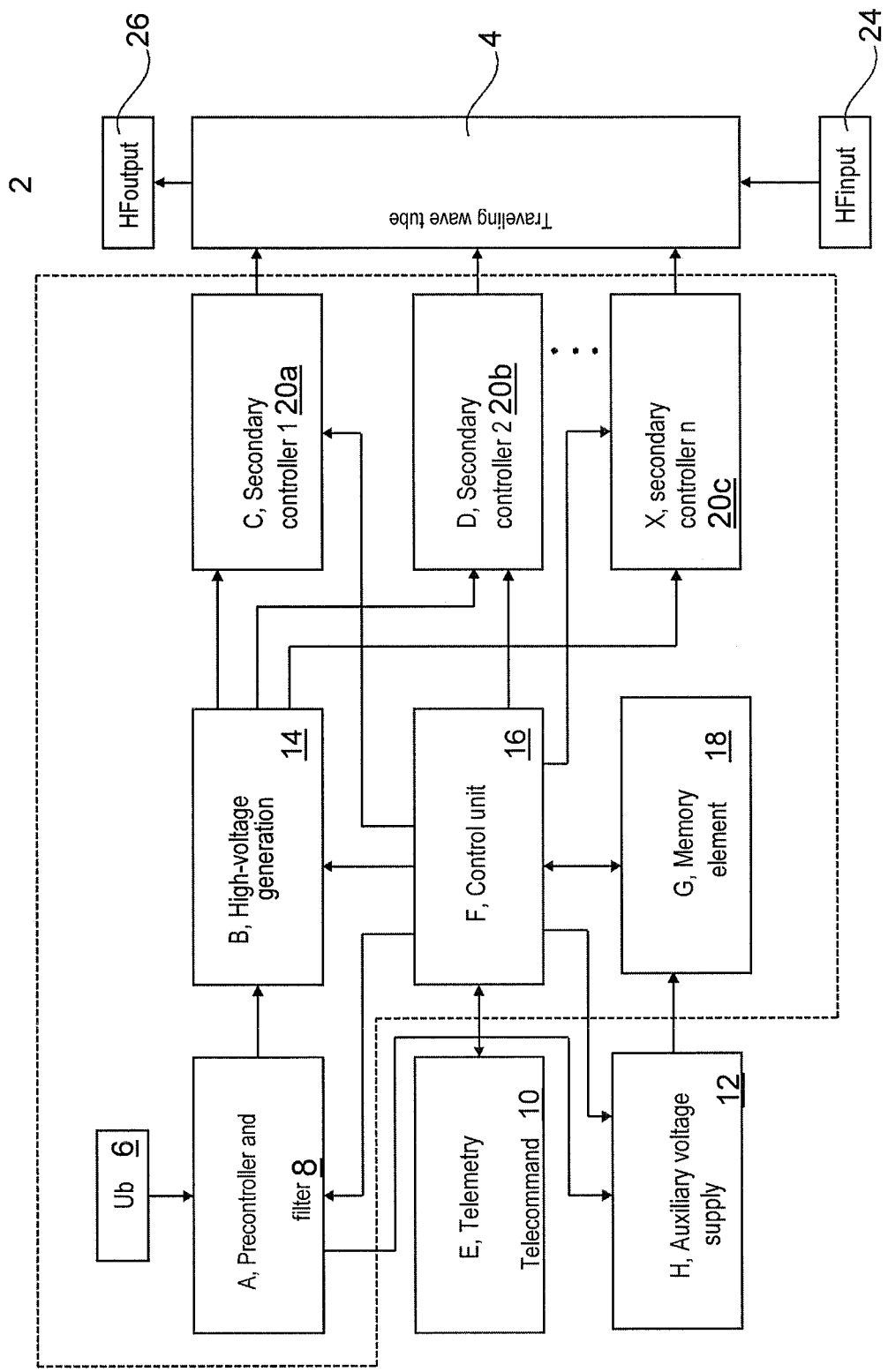
FIG. 1 depicts a sample design of a block diagram of an adjustable power supply for a traveling wave tube according to the present invention.

In reference to FIG. 1, a sample design of a block diagram of an adjustable power supply for a traveling wave tube according to the present invention is depicted.

Control apparatus 2 for traveling wave tube 4 has control element 16, which is arranged to receive from a telemetry or telecommand unit 10 information regarding a desired operating state of traveling wave tube 4. Control unit 16 is thereby connected to memory element 18, in which at least one operating energy value parameter sets, of which there are at least one, are stored, which provide information as to how individual elements, e.g., elements 8, 12, 14 and/or 20a,b,c, of an energy supply unit of control apparatus 2 are to be set. Traveling wave tube 4 thus exemplifies an RF transmit amplifier unit.

Setting refers to influencing, based on the operating energy value parameter set, at least one element of a precontroller or filter 8, high-voltage generation 14, an auxiliary voltage supply unit 12 as well as one or more secondary controllers 20a,b,c in such a manner that these each provide the required operating energy values with which traveling wave tube 4 can be influenced and thus operated. Accordingly, not all operating energy values must be provided directly to traveling wave tube 4; for example, high-voltage generation 14 can for its part provide its operating energy value to another element, such as the three secondary controllers 20a, b, c for example, which in turn use their input values from high-voltage generation 14 as well as control unit 16 to forward suitable operating energy values to traveling wave tube 4.

In this way, the amplifier is provided with voltage by the satellite via voltage input 6Ub. By means of filter and/or precontroller unit 8, this voltage is supplied to high-voltage generating element 14, which for its part generates various supply voltages for traveling wave tube 4. These supply voltages can, as depicted in FIG. 1 for example purposes, be processed and influenced using other secondary controller units 20a, b, c and then only be forwarded to traveling wave tube 4.

For example, telemetry/telecommand unit 10 connects a control station on the ground to the satellite. The ground station can thus forward control commands to the satellite, particularly to the amplifier; in return, the satellite may forward information regarding its operating state to the ground station. Control unit 16 essentially regulates and controls all processes in the control apparatus.

The target values for all supply voltages, which also represent an operating state of the control apparatus in a certain operating state, for example in relation to a frequency band of traveling wave tube 4, can be stored in non-volatile memory element 18. There, other data sets may also be stored, which for example were defined and tested in ground tests within the scope of manufacturing the satellite and preparing its commissioning.

Via telemetry and command interface 10, one can retrieve the various data sets and thereby operate traveling wave tube 4 in various operating states, depending in which frequency range the amplifier is to be operated or a data transmission is to be undertaken. In this way, one can in particular advantageously set exclusive operating states that were previously tested and that had their correctness verified.

When setting the amplifier to a desired frequency range, the corresponding data block, thus an operating energy value parameter set, is retrieved from memory element 18 and then set as an operating energy value set.

Such a setting can be carried out in various ways. For example, the target value for precontroller/filter element 8 can be set, whereby the input voltage for the high-voltage generating unit 14 and thus one or more supply voltage(s) changes. Or alternatively, the target values for high-voltage generating unit 14 itself can be set. This hereby changes one up to all high voltage(s), which are then forwarded to secondary controllers 20a, b, c or also directly to traveling wave tube 4. In addition, for high-voltage generating unit 14, secondary controllers 20a, b, c can also be set. As an alternative, only the target values for secondary controllers 20a, b, c can be set, whereby 1 to n discrete voltages can be set and forwarded to traveling wave tube 4. High-frequency input 24 and high-frequency output 26 for the transmission channel is connected, according to FIG. 1, directly to traveling wave tube 4, for example via the input lead or output lead of a helix of traveling wave tube 4.

Figure 2:
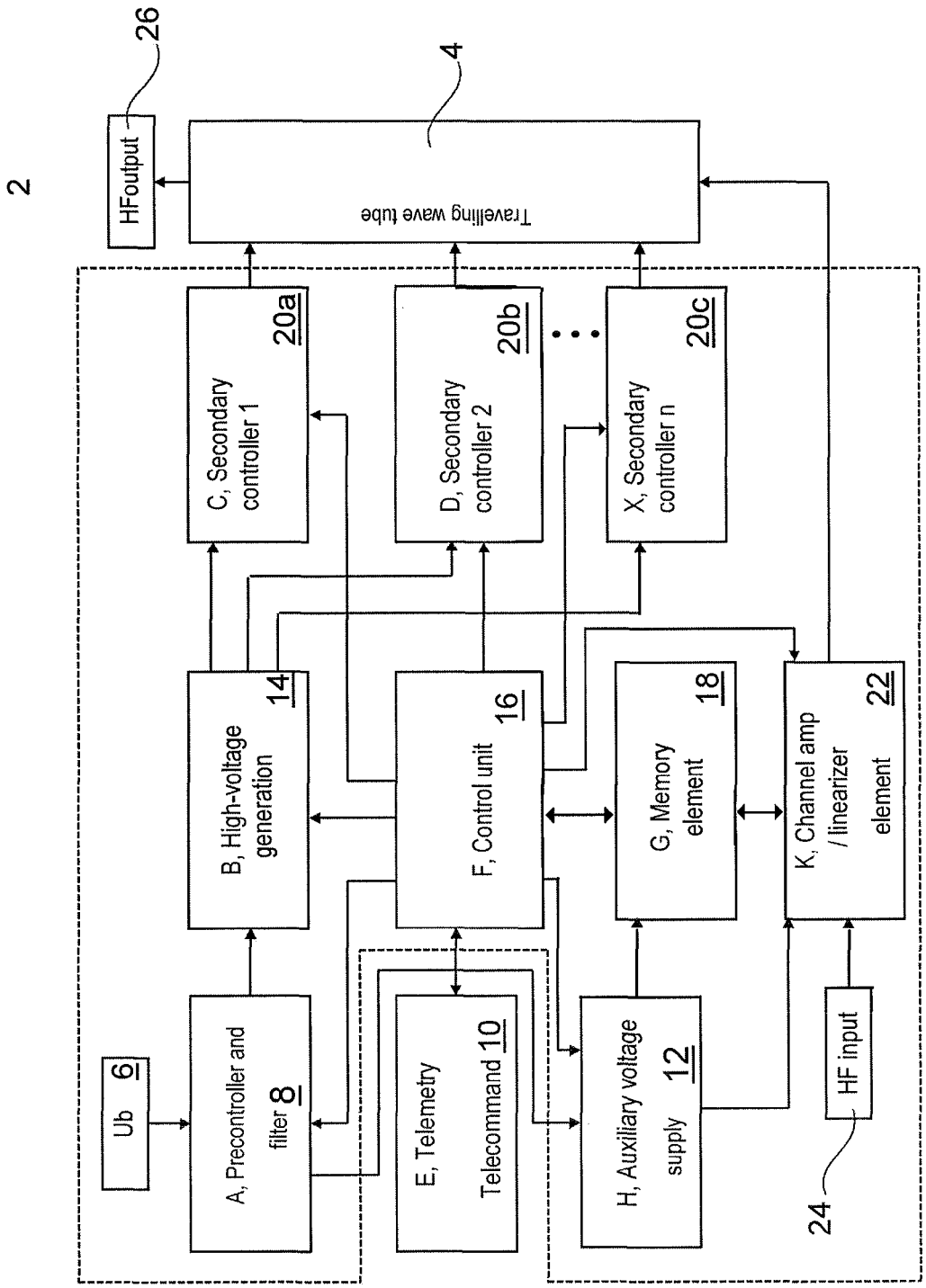
FIG. 2 depicts a sample design of another block diagram of an adjustable power supply for a traveling wave tube according to the present invention with a channel amplifier/linearizer.

FIG. 1, as well as FIG. 2, illustrate a design combining memory elements and energy supply elements. The depiction as individual blocks A to H, K, and X however illustrate the functional autonomy of the elements and the associated flexible combinability of individual elements into complex groups.

In further reference to FIG. 2, another sample design of a block diagram of an adjustable power supply for a traveling wave tube according to the present invention with a channel amplifier/linearizer is depicted.

FIG. 2 essentially corresponds to FIG. 1, wherein additionally a channel amplifier/linearization element 22 is provided, which has a high-frequency input 24. An output of channel amplifier/linearizer 22 is connected to the input of traveling wave tube 4. Thus, by the additional furnishing of channel amplifier/linearizer 22, FIG. 2 essentially represents a microwave power module compared to a TWTA of FIG. 1.

Given that according to FIG. 2, reference is made to a microwave power module, then channel amplifier/linearizer can also be set by the controller to match a required operating state/frequency band and/or modulation process of the data transmission. In doing so, the control information can be forwarded internally, if channel amplifier/linearizer 22 is integrally connected to control apparatus 2, or externally via a cable harness, for example in the event of a discrete implementation. Accordingly, channel amplifier/linearizer 22 provides signal preprocessing of the high-frequency signal. This signal preprocessing or influencing of the transmission characteristic of the linearization element 22 can thus also be adapted to a certain operating state. Adapting channel amplifier/linearizer 22 in respect to a desired modulation process while maintaining the same frequency band is feasible.

One should generally mention that besides the already stated settings of a control apparatus 2 or an EPC for a traveling wave tube, control element 16 also allows one to set various parameters in the preamplifier. In addition, target values for various current and/or voltage sources can be regularly changed in such a manner that a desired or required characteristic of the preamplifier can be set. These settings can be stored in a block-wise manner, wherein usually a data set of the preamplifier setting is stored to match a data set of the control apparatus. The preamplifier setting may be stored in memory element 18. However, it is also possible to store multiple preamplifier data sets per control apparatus data set, if for example the channel is to be optimized to various modulation processes.

With further reference made to FIG. 3, a sample comparison of high-frequency output power and intake power is depicted for various operating states of a traveling wave tube according to the present invention.

FIG. 3 depicts for example purposes a high-frequency output power and power intake for various operating states of an amplifier with a control apparatus according to the present invention. For example purposes, reference here is made to a Ku band amplifier in the range of 10.95-12.2 GHz. The data regarding WB (wide band) was recorded with an operating state that provides the entire frequency range. The data listed for NB (narrow band) was measured in an operating state optimized to the respective frequency range. One can see a possible savings in the power intake of up to 10 W.

Also referencing FIG. 4, a sample design depicts a method for setting an operating state of a traveling wave tube according to the present invention.

FIG. 4 depicts a method 40 for setting an operating state of a traveling wave tube 4, particularly an earth-distant platform, having reception 42 of a control signal, selection 44 of an operating energy value parameter set from a plurality of operating energy value parameter sets, which are stored locally in a memory element 18, and setting 46 of an operating state of a traveling wave tube 4, based on the selected operating energy value parameter set.

In addition, it is pointed out that "having" or "comprising" do not exclude other elements or steps and that "a" does not exclude a plurality. Furthermore, it is pointed out that features or steps that were described with reference to one of the aforementioned embodiments can be also used in combination with other features or steps of other aforementioned embodiments.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

Reference signs in the claims shall not be considered limitations.

LIST OF REFERENCE SIGNS

2 Control apparatus
4 RF transmit amplifier unit
6 Supply voltage
8 Precontroller/filter
10 Telemetry/telecommand element
12 Auxiliary voltage supply
14 High-voltage generating unit
16 Control unit
18 Memory element
20a,b,c Secondary controller
22 Channel amplifier/linearization element
24 High-frequency input
26 High-frequency output

What is claimed is:

1. A control apparatus for an earth-distant platform, comprising:
   a control unit with at least one control input and a control output; and
   a memory element,
   wherein the memory element is stores a plurality of operating value parameter sets for at least an RF transmit amplifier unit;
   wherein the control input is configured to receive a control signal,
   wherein the control unit is configured to select, based on the control signal, an operating value parameter set from the memory element, and
   wherein the control output is configured to, using the selected operating value parameter set, influence an energy supply unit or a preamplifier/linearization element in such a manner that the RF transmit amplifier unit operates in a defined operating state.

2. The control apparatus according to claim 1, further comprising:
   at least one of an energy supply unit and a preamplifier/linearization element,
   wherein the energy supply unit is configured to provide a plurality of operating values to the RF transmit amplifier unit, wherein the plurality of operating values define an operating value set,
   wherein the operating value set determines an operating state of the RF transmit amplifier unit,
   wherein a plurality of operating states are determined using the plurality of operating value sets,
   wherein the preamplifier/linearization element has a high-frequency input and a high-frequency output connected to an RF transmit amplifier unit and is configured to receive a high-frequency signal via the high-frequency input and to preprocess the received high-frequency signal taking into consideration an operating state of the RF transmit amplifier unit, and
   wherein the set operating value parameter has at least a parameter for setting the linearization element to adapt the preprocessing of the high frequency signal to a certain operating state of the RF transmit amplifier unit.

3. The control apparatus according to claim 2, wherein the RF transmit amplifier unit captures a certain operating mode by setting or issuing an operating value set of the energy supply unit to the RF transmit amplifier unit.

4. The control apparatus according to claim 2, wherein the control unit comprises:
   at least two RF transmit amplifier units;
   at least two preamplifier/linearization elements; and
   at least an energy supply unit,
   wherein one of the at least two RF transmit amplifier unit is assigned to each of the preamplifier/linearization elements,
   wherein the at least one energy supply unit is configured to operate the at least two RF transmit amplifier units, and
   wherein the memory element has operating value parameter sets for the at least one energy supply unit and the at least two preamplifier/linearization elements.

5. The control apparatus according to claim 1, wherein the operating values are values from a group consisting of currents or voltages that can be connected or forwarded to an RF transmit amplifier unit, a helix voltage, a collector voltage, a cathode current, an anode-0 voltage, an anode-1 voltage, a heater voltage, a Wehnelt voltage, an amplitude expansion, a phase shift, a frequency response, and an amplification.

6. The control apparatus according to claim 1, wherein the operating state influences or determines at least the frequency operating range of the RF transmit amplifier unit.

7. The control apparatus according to claim 1, wherein the apparatus is configured to be adaptable to a required modulation process for a data transmission by a plurality of operating value parameter sets.

8. The control apparatus according to claim 1, wherein the memory element is arranged in the control unit, in the energy supply unit, in the preamplifier/linearizer, or is a distributed memory element arranged in several of the control, energy supply, and preamplifier/linearizer units.

9. The control apparatus according to claim 1, wherein the RF transmit amplifier element is an element from the group consisting of a traveling wave tube and a semiconductor amplifier.

10. A satellite, comprising:
a control apparatus, which comprises
a control unit with at least one control input and a control output; and
a memory element,
wherein the memory element is stores a plurality of operating value parameter sets for at least an RF transmit amplifier unit;
wherein the control input is configured to receive a control signal,
wherein the control unit is configured to select, based on the control signal, an operating value parameter set from the memory element, and
wherein the control output is configured to, using the selected operating value parameter set, influence an energy supply unit or a preamplifier/linearization element in such a manner that the RF transmit amplifier unit operates in a defined operating state.

11. The satellite according to claim 10, wherein the control signal is received by the satellite from an external source located on the earth's surface.

12. A method for setting an operating state of an RF transmit amplifier unit on an earth-distant platform, the method comprising:
receiving, by the earth-distant platform, a control signal;
selecting, by the earth-distant platform, an operating value parameter set from a plurality of operating value parameter sets, which are stored in memory element of the earth-distant platform; and
setting, by the earth-distant platform, the operating state of the RF transmit amplifier unit based on the selected operating value parameter set.

* * * * *